United States Patent
Uemura

(10) Patent No.: US 8,427,215 B2
(45) Date of Patent: Apr. 23, 2013

(54) SEMICONDUCTOR INTEGRATED CIRCUIT

(75) Inventor: Taiki Uemura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/072,937

(22) Filed: Mar. 28, 2011

(65) Prior Publication Data
US 2011/0309862 A1 Dec. 22, 2011

(30) Foreign Application Priority Data
Jun. 22, 2010 (JP) ................... 2010-141991

(51) Int. Cl.
*H03K 3/289* (2006.01)
(52) U.S. Cl.
USPC .......................................................... 327/202
(58) Field of Classification Search .......................... None
See application file for complete search history.

(56) References Cited

U.S. PATENT DOCUMENTS

| 6,181,185 B1 * | 1/2001 | Shepston | 327/295 |
| 8,161,441 B2 * | 4/2012 | Wang et al. | 716/108 |
| 2008/0315932 A1 * | 12/2008 | Tower et al. | 327/202 |

FOREIGN PATENT DOCUMENTS
JP 2002-185309 A 6/2002

* cited by examiner

*Primary Examiner* — Lincoln Donovan
*Assistant Examiner* — Sibin Chen
(74) *Attorney, Agent, or Firm* — Westerman, Hattori, Daniels & Adrian, LLP

(57) ABSTRACT

A semiconductor integrated circuit including: a first data hold circuit configured to hold an input signal from a first input terminal; a second data hold circuit configured to hold the input signal from the first input terminal and an input signal from a second input terminal; a gate circuit configured to input an output signal of the first data hold circuit and an output signal of the second data hold circuit and to output a signal corresponding to the output signals of the first and second data hold circuits when the output signals of the first and second data hold circuits are the same as each other; and a third data hold circuit configured to hold the output signal of either the gate circuit or the second data hold circuit, and outputs the output signal to an output terminal.

12 Claims, 7 Drawing Sheets

NORMAL OPERATION

SCAN OPERATION

US 8,427,215 B2

SEMICONDUCTOR INTEGRATED CIRCUIT

CROSS-REFERENCE TO RELATED APPLICATION

This application is based upon and claims the benefit of priority of the prior Japanese Patent Application No. 2010-141991, filed on Jun. 22, 2010, the entire contents of which are incorporated herein by reference.

FIELD

A certain aspect of the embodiments discussed herein is related to a semiconductor integrated circuit.

BACKGROUND

In a semiconductor integrated circuit used for a scan test of logic circuits, there is known a semiconductor integrated circuit configured to have an input terminal for data and another terminal for a test signal and to have a common data hold circuit connected to these input terminals. In such a semiconductor integrated circuit, there is known a semiconductor integrated circuit configured to have multiple data hold circuits connected to the data input terminal and a gate circuit that carries out a majority logic operation on the multiple data hold circuits (see Japanese Laid-Open Patent Application No. 2002-185309). With this structure, even if data is erroneously inverted in one of the data hold circuits, it is possible to output correct data by the gate circuit of the majority logic as long as the other data hold circuits hold correct data.

In the above-described semiconductor integrated circuit, in case where a soft error occurs in any of the data hold circuits, the output of the gate circuit for making the majority logic is floating, and data may be destroyed due to a leakage or the like. In order to prevent data from being destroyed, an additional data hold circuit may be connected to the output of the gate circuit. However, the use of the additional data hold circuit increases the circuit area.

SUMMARY

According to an aspect of the present invention, there is provided a semiconductor integrated circuit including: a first data hold circuit configured to hold an input signal from a first input terminal; a second data hold circuit configured to hold the input signal from the first input terminal and an input signal from a second input terminal; a gate circuit configured to input an output signal of the first data hold circuit and an output signal of the second data hold circuit and to output a signal corresponding to the output signals of the first and second data hold circuits when the output signals of the first and second data hold circuits are the same as each other; and a third data hold circuit configured to hold the output signal of either the gate circuit or the second data hold circuit, and outputs the output signal to an output terminal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, a semiconductor integrated circuit in accordance with a comparative example is described.

Figure 1:
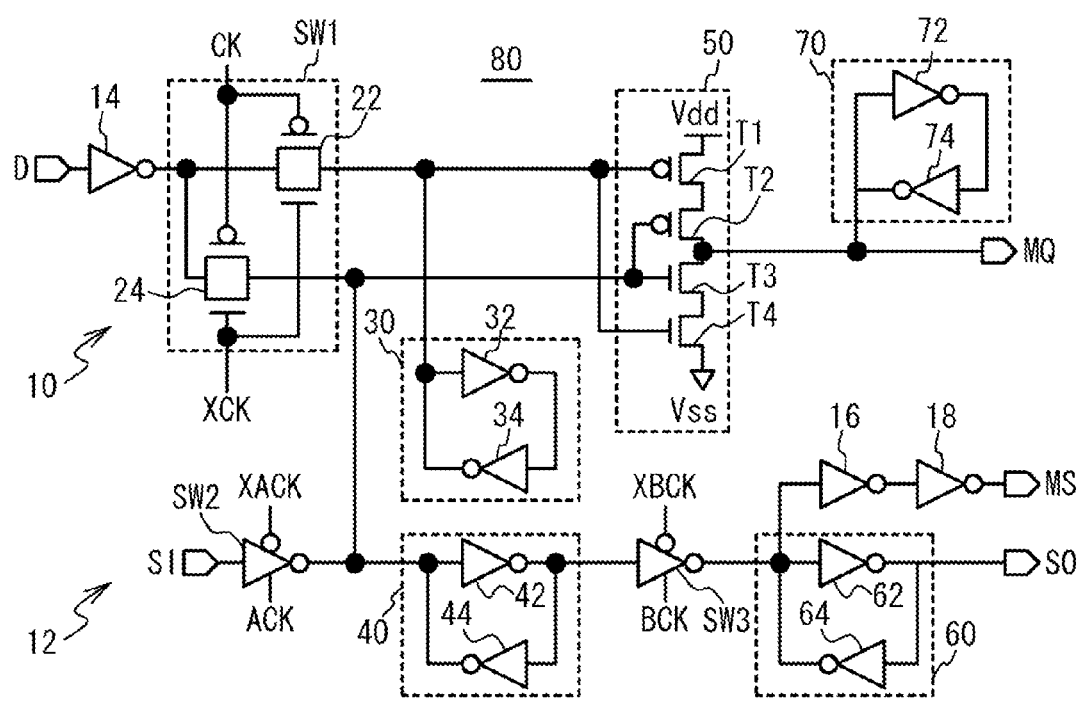
FIG. 1 is a circuit diagram of a semiconductor integrated circuit in accordance with a comparative example.

FIG. 1 is a circuit diagram of a configuration of a semiconductor integrated circuit used for a scan test. A scan test circuit 80 in accordance with the comparative example has a data input terminal D for inputting a data signal and a scan input terminal SI for inputting a test signal (scan data). The data input terminal D corresponds to a first input terminal, and the scan input terminal corresponds to a second input terminal. The data input terminal D is an input terminal of a data latch circuit 10, which operates in a normal operation. The scan input terminal SI is an input terminal of a scan latch circuit 12, which operates in a scan operation. As will be described below, the data latch circuit 10 and the scan latch circuit 12 share some circuit elements.

The data latch circuit 10 is configured as follows. The data input terminal D is connected to a first data hold circuit 30 and a second data hold circuit 40 via an inverter 14 and a first switch SW1. A gate circuit 50 is connected to the first data hold circuit 30 and the second data hold circuit 40. A fourth data hold circuit 70 is connected to the output side of the gate circuit 50, and a data output terminal MQ is also connected thereto.

The scan latch circuit 12 is configured as follows. The scan input terminal SI is connected to the second data hold circuit 40 via a second switch SW2. The second data hold circuit 40 is connected to a third data hold circuit 60 via a third switch SW3. An output terminal S0 for scan data is connected to the third data hold circuit 60, and another output terminal MS is connected thereto via inverters 16 and 18.

The first switch SW1 includes path gates 22 and 24, which are driven by a clock signal CK and its inverted signal XCK. An input signal applied via the data input terminal D is split into two signals at a rear stage of the inverter 14, one of which is input to the first data hold circuit 30 via the path gate 22, and the other is input to the second data hold circuit 40 via the path gate 24.

The first data hold circuit 30 includes two inverters 32 and 34 connected in a loop form. Similarly, the second data hold circuit 40 has two inverters 42 and 44 connected in a loop form. These connections form a configuration called feedback loop. This configuration may be replaced by another configuration capable of holding data. The third data hold circuit 60 and the fourth data hold circuit 70 may be configured similarly. The signals held by the first data hold circuit 30 and the second data hold circuit 40 are applied to the gate circuit 50.

The gate circuit 50 includes a p-type transistor T1, a p-type transistor T2, an n-type transistor T3, and an n-type transistor T4, which transistors are connected in series between a first power supply Vdd and a second power supply Vss. The output signal of the first data hold circuit 30 is applied to the gate of the p-type transistor T1 and that of the n-type transistor T4, and the output signal of the second data hold circuit 40 is applied to the gate of the p-type transistor T2 and that of the n-type transistor T3. The output signal of the gate circuit 50 is available at an intermediate node between the p-type transistor T2 and the n-type transistor T3.

In a case where data held by the first data hold circuit 30 and data held by the second data hold circuit 40 are the same as each other, the gate circuit 50 outputs the inverted signal of the data. In a case where the first data hold circuit 30 and the second data hold circuit 40 hold different data, the output of the gate circuit 50 is floating.

The fourth data hold circuit 70 includes two inverters 72 and 74 connected in a loop form. The fourth data hold circuit 70 holds the output signal of the gate circuit 50. When the output of the gate circuit 50 is floating, the fourth data hold circuit 70 outputs data already held to the data output terminal MQ.

The second switch SW2 is driven by a clock signal ACK and its inverted signal XACK. The third switch SW3 is driven by a clock BCK and its inverted clock XBCK. The input signal applied via the scan input terminal SI is input to the second data hold circuit 40 in synchronism with the first clock, and is input to the third data hold circuit 60 in synchronism with the next clock. The third data hold circuit 60 includes two inverters 62 and 64 connected in a loop form. Data held by the third data hold circuit 60 is output from the output terminal S0, and data held by the third data hold circuit 60 is additionally output from the output terminal MS via the inverters 66 and 68.

According to the scan test circuit 80 of the comparative example, in the case where data held by the first data hold circuit 30 and data held by the second data hold circuit 40 are the same as each other, the gate circuit 50 outputs the inverted signal of the above data. Thus, even when data inversion takes place due to error in one of the first data hold circuit 30 and the second data hold circuit 40, the influence of the error is not transmitted to the rear stage of the gate circuit 50. Thus, the scan test circuit 80 is capable of outputting correct data.

Further, according to the scan test circuit 80 of the comparative example, since the fourth data hold circuit 70 is provided at the rear stage of the gate circuit 50, it is possible to suppress destroy of data due to leakage even when the output of the gate circuit 50 is floating. However, the presence of the fourth data hold circuit 70 at the rear stage of the gate circuit 50 increases the circuit area and makes it difficult to downsize the scan test circuit 80.

Embodiments described below have improved configurations.

First Embodiment

Figure 2:
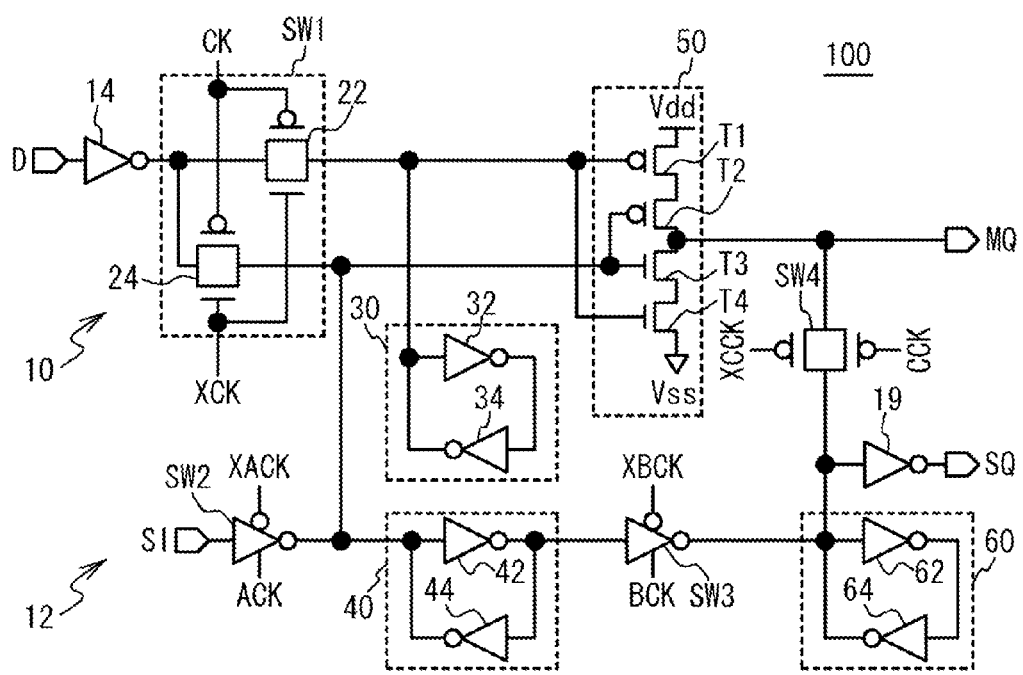
FIG. 2 is a circuit diagram of a semiconductor integrated circuit in accordance with a first embodiment.

FIG. 2 is a circuit diagram of a semiconductor integrated circuit (scan test circuit 100) in accordance with a first embodiment. In FIG. 2, parts that are the same as corresponding those of the comparative example in FIG. 1 are given the same reference numerals, and a description thereof is omitted here.

The first embodiment differs from the comparative example in the configuration of the rear state of the gate circuit 50 and the configuration of the periphery of the third data hold circuit 60. As illustrated in FIG. 2, the output side of the gate circuit 50 is connected to the data output terminal MQ and is connected to the third data hold circuit 60 via a gate output switch (hereinafter, this switch is referred to as fourth switch SW4). The third data hold circuit 60 is connected to a scan output terminal SQ via an inverter 19. The drivability of the third data hold circuit 60 is smaller than that of the gate circuit 50. According to the first embodiment, the third data hold circuit 60 has the roles of both the third data hold circuit 60 and the fourth data hold circuit 70. Now, this configuration will be described in detail.

Figure 3A:
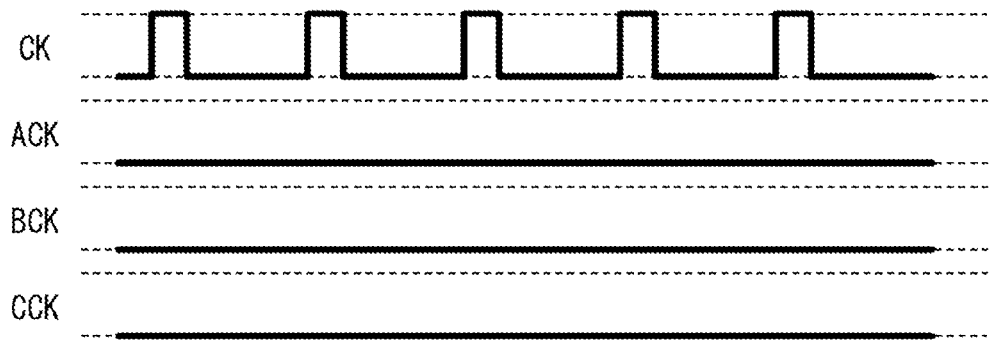
FIGS. 3A and 3B are timing charts of operations of the semiconductor integrated circuit of the first embodiment.
Figure 3B:
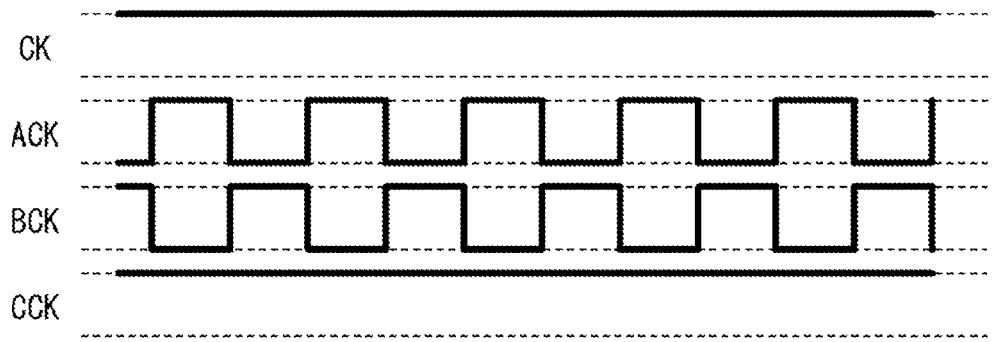
Figure 4A:
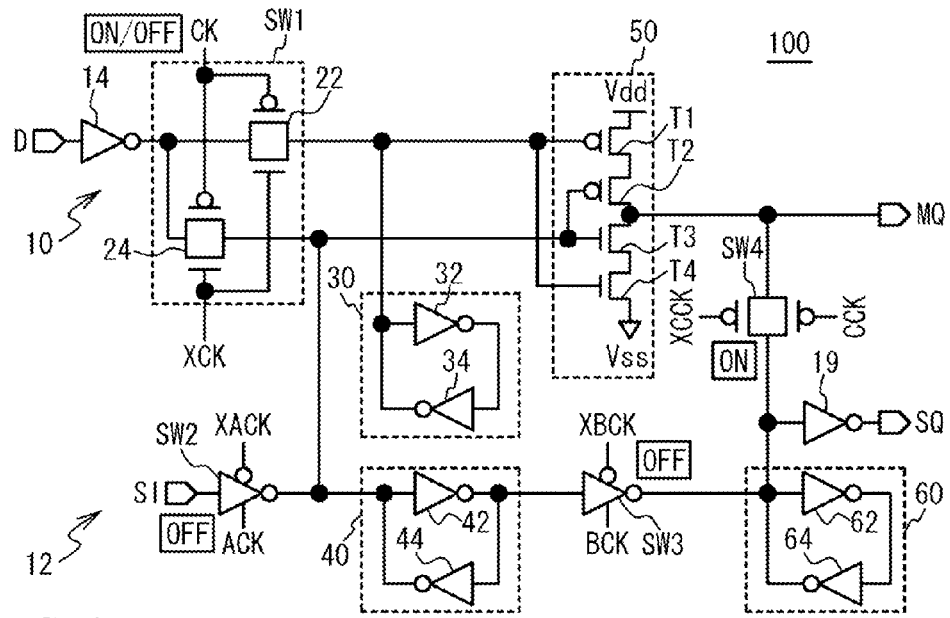
FIGS. 4A and 4B are circuit diagrams that indicate operations of the semiconductor integrated circuit of the first embodiment.
Figure 4B:
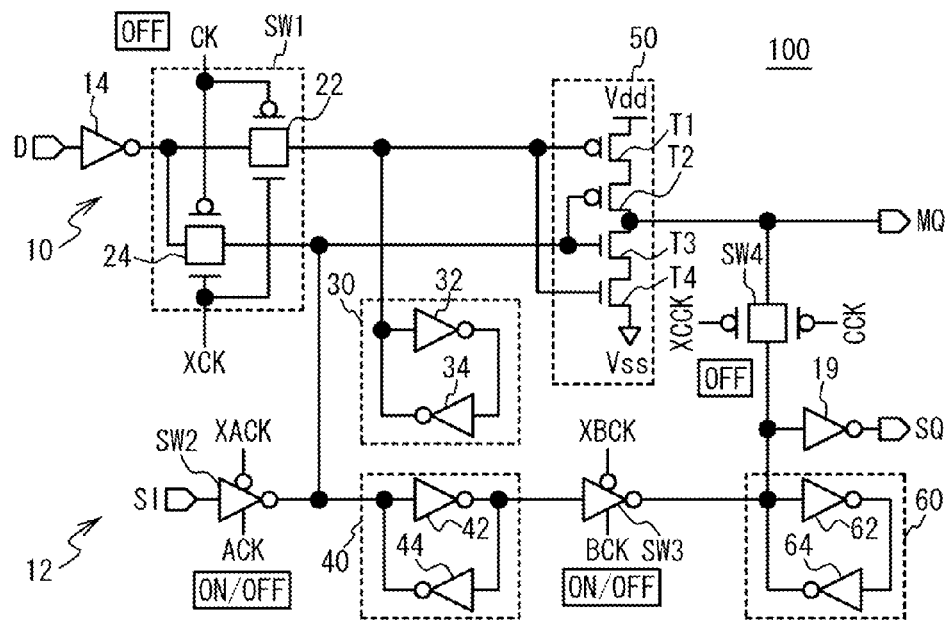

FIGS. 3A and 3B are timing charts of operations of the semiconductor integrated circuit in accordance with the first embodiment, and FIGS. 4A and 4B are circuit diagrams associated with the operations. FIGS. 3A and 4A illustrate a circuit operation in a normal operation, and FIGS. 3B and 4B illustrate a circuit operation in a scan operation.

As illustrated in FIG. 3A, in the normal operation, the clock signal CK defines pulses at predetermined intervals, and the clock signals ACK, BCK and CCK are at the low level. Thus, as illustrated in FIG. 4A, the first switch SW1 is kept ON only during a period when the clock signal CK is at the low level, and allows the input signal from the data input terminal D to pass through the first switch SW1. At this time, the second switch SW2 and the third switch SW3 are constantly OFF, while the fourth switch SW4 is constantly ON.

At the time of writing data in the normal operation (when the clock signal CK is at the low level), the first switch SW1 and the fourth switch SW4 are turned ON, and input data is written in the first data hold circuit 30, the second data hold circuit 40 and the third data hold circuit 60. At the time of holding data in the normal operation (when the clock signal CK is at the high level), only the fourth switch SW4 is set ON, and a signal corresponding to the data held in the first data hold circuit and the second data hold circuit is output to the data output terminal MQ from the gate circuit 50. The third data hold circuit 60 holds the output signal of the gate circuit 50.

As illustrated in FIG. 3B, in the scan operation, the clock signals CK and CCK are constantly at the high level, and the clock signals ACK and BCK define pulses at given pulse intervals. At this time, the signal levels of the clock signals ACK and BCK are constantly opposite to each other. Thus, as illustrated in FIG. 4B, the second switch SW2 is set ON only during a time when the clock signal ACK is at the low level and allows the scan input signal to pass through the second switch SW2. The third switch SW3 is set ON only during a time when the clock signal BCK is at the low level, and allows the scan signal to pass through the third switch SW3. At this time, the first switch SW1 and the fourth switch SW4 are constantly set OFF.

As described above, it is possible to selectively operate the scan test circuit 100 of the first embodiment as the data latch circuit 10 and the scan latch circuit 12 like the comparative example.

A description will now be given of an operation in a case where the logic of the data hold circuit is inverted due to soft error when the data is held in the normal operation.

Figure 5A:
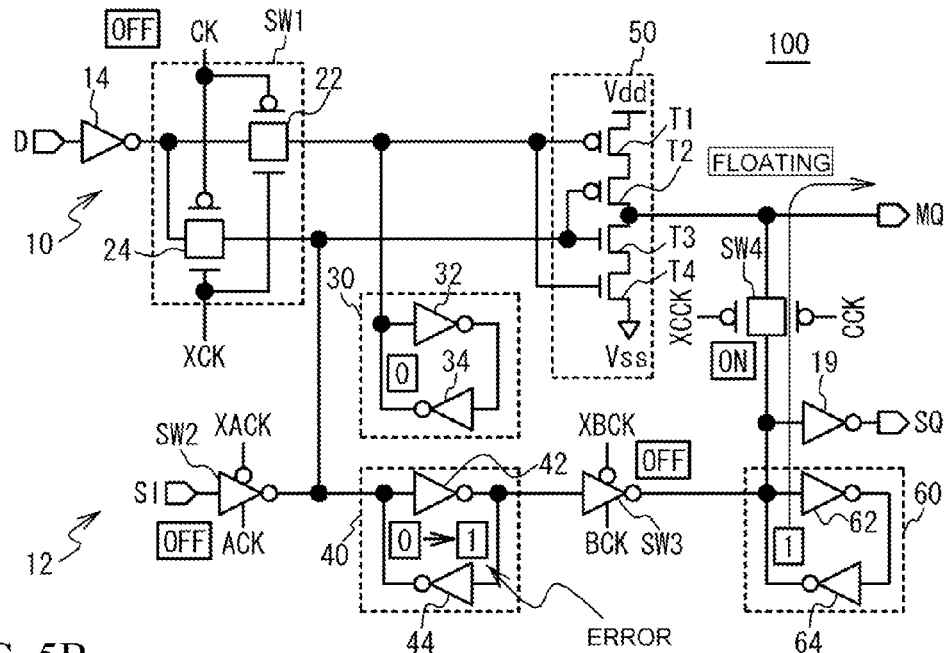
FIGS. 5A and 5B are circuit diagrams that indicate operations of the semiconductor integrated circuit of the first embodiment when an error occurs.
Figure 5B:
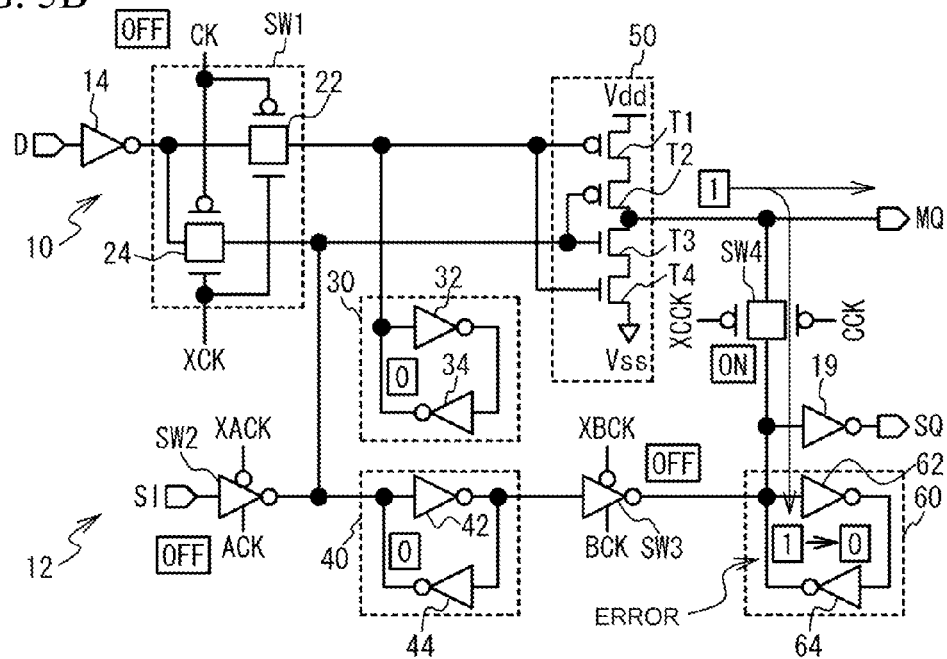

FIGS. 5A and 5B are circuit diagrams for describing operations when an error occurs in the semiconductor integrated circuit of the first embodiment. FIG. 5A illustrates a case where an error occurs in the second data hold circuit 40, and FIG. 5B illustrates another case where an error occurs in the third data hold circuit 60.

As illustrated in FIG. 5A, in a case where data "0" is held in the first data hold circuit 30 and the second data hold circuit 40 and data "1" is held in the third data hold circuit 60, it is assumed that data held in the second data hold circuit 40 is inverted to "1". In this case, since the two input signals applied to the gate circuit 50 are different from each other, the output signal of the gate circuit 50 is floating. However, since correct data "1" is held in the third data hold circuit 60, the output data of the latch circuit is also "1". Thus, data is not destroyed.

In contrast, as illustrated in FIG. 5B, in a case where data "0" is held in the first data hold circuit 30 and the second data hold circuit 40 and data "1" is held in the third data hold circuit 60, it is assumed that data held in the third data hold circuit 60 is inverted to "1". In this case, since the two input signals applied to the gate circuit 50 are the same as each other, the output of the gate circuit 50 is "1", which is the inverted signal of "0". As has been described previously, since the drivability of the gate circuit 50 is greater than that of the third data hold circuit 60, the output data of the scan test circuit 100 is "1", which is the same as the output of the gate circuit 50. Thus, data is not destroyed. Additionally, the data held in the third data hold circuit 60 is overwritten to "1" from "0", and the soft error is thus corrected.

As described above, according to the scan test circuit 100 of the first embodiment, even if soft error occurs in any of the first data hold circuit 30 through the third data hold circuit 60, data is not destroyed but correct data is output. The third data hold circuit 60 is configured to hold any of the output signal of the gate circuit 50 and the output signal of the second data hold circuit 40. The output signal to be held is determined by the operation mode. The third data hold circuit 60 has the role of a keeper that holds the output signal of the gate circuit 50 in the data latch circuit 10 and the role of a slave latch that holds the scan output signal in the scan latch circuit 12. Thus, there is no need to separately provide the aforementioned two circuits (keeper and slave latch) of the comparative example. Thus, it is possible to suppress destroy of data due to soft error and reduce the circuit area.

According to the scan test circuit 100 of the first embodiment, the second switch SW4 is provided between the gate circuit 50 and the third data hold circuit 60, and the fourth switch SW4 is constantly OFF at the time of the scan test. It is thus possible to suppress data held in the third data hold circuit 60 from being overwritten by the output signal of the gate circuit 50.

Second Embodiment

A second embodiment is an exemplary variation of the gate circuit.

Figure 6:
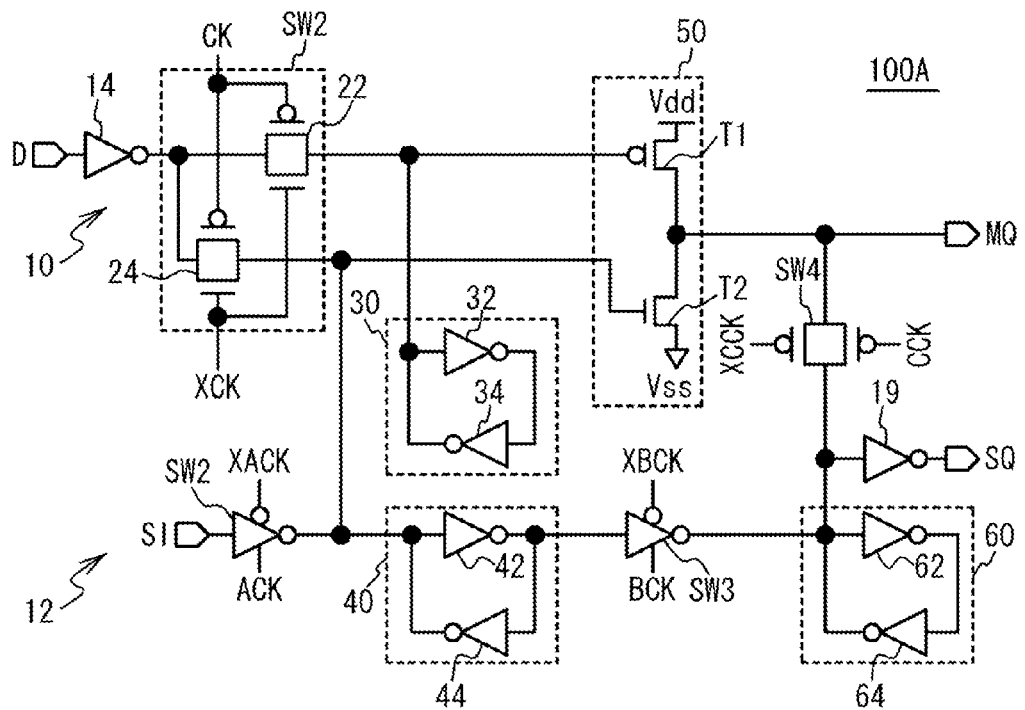
FIG. 6 is a circuit diagram of a semiconductor integrated circuit in accordance with a second embodiment.

FIG. 6 is a circuit diagram of a semiconductor integrated circuit (scan test circuit 100A) in accordance with the second embodiment. Parts of the second embodiment that are the same as corresponding those of the first embodiment (FIG. 2) are given the same reference numerals, and a description thereof is omitted here.

The second embodiment differs from the first embodiment in the configuration of the gate circuit 50. As illustrated, the gate circuit 50 includes the p-type transistor T1 and the n-type transistor T2 connected in series between the first power supply Vdd and the second power supply Vss. The output signal of the first data hold circuit 30 is applied to the gate of the p-type transistor T1. The output signal of the second data hold circuit 40 is applied to the gate of the n-type transistor T2. The output signal of the gate circuit is output from the intermediate node between the p-type transistor T1 and the n-type transistor T2. In the second embodiment, the drivability of the third data hold circuit 60 is smaller than that of the gate circuit 50, and is greater than half the drivability of the gate circuit 50.

In a case where data held by the first data hold circuit 30 and data held by the second data hold circuit 40 are both at the high level, the p-type transistor T1 and the n-type transistor T2 are turned OFF, and the output of the gate circuit 50 is thus floating. In a case where the data held by the first data hold circuit 30 is at the low level and data held by the second data hold circuit 40 is at the high level, both the p-type transistor T1 and the n-type transistor T2 are turned ON, and the output of the gate circuit is at an intermediate level between Vdd and Vss.

The operation of the scan test circuit 100A of the second embodiment is primarily identical to that of the first embodiment. A description will now be given of an operation in a case where the logic of the data hold circuit is inverted due to soft error when the data is held in the normal operation.

In a case where soft error occurs in either the first data hold circuit 30 or the second data hold circuit 40, the output of the gate circuit 50 is floating or at the intermediate level, as described above. Since the drivability of the third data hold circuit 60 is greater than half the drivability of the gate circuit 50, the signal held in the third data hold circuit 60 is given priority to the output signal of the gate circuit 50, and is output via the data output terminal MQ.

In contrast, in a case where soft error occurs in the third data hold circuit 60, the output of the gate circuit 50 is retained correctly. As described above, since the drivability of the third data hold circuit 60 is smaller than that of the gate circuit 50, the output signal of the scan test circuit 100A is the same as the output signal of the gate circuit 50, and data is not destroyed. Additionally, the signal held in the third data hold circuit 60 is overwritten by the output signal of the gate circuit 50 and the soft error is corrected.

As described above, according to the scan test circuit 100A of the second embodiment, it is possible to suppress destroy of data due to soft error and reduce the circuit area like the first embodiment. Further, the second embodiment realizes a smaller number of parts that form the gate circuit 50 than that of the first embodiment, and further reduces the circuit area.

Third Embodiment

A third embodiment is an example of a configuration that enables data to be directly applied to the third data hold circuit from the data input terminal.

Figure 7:
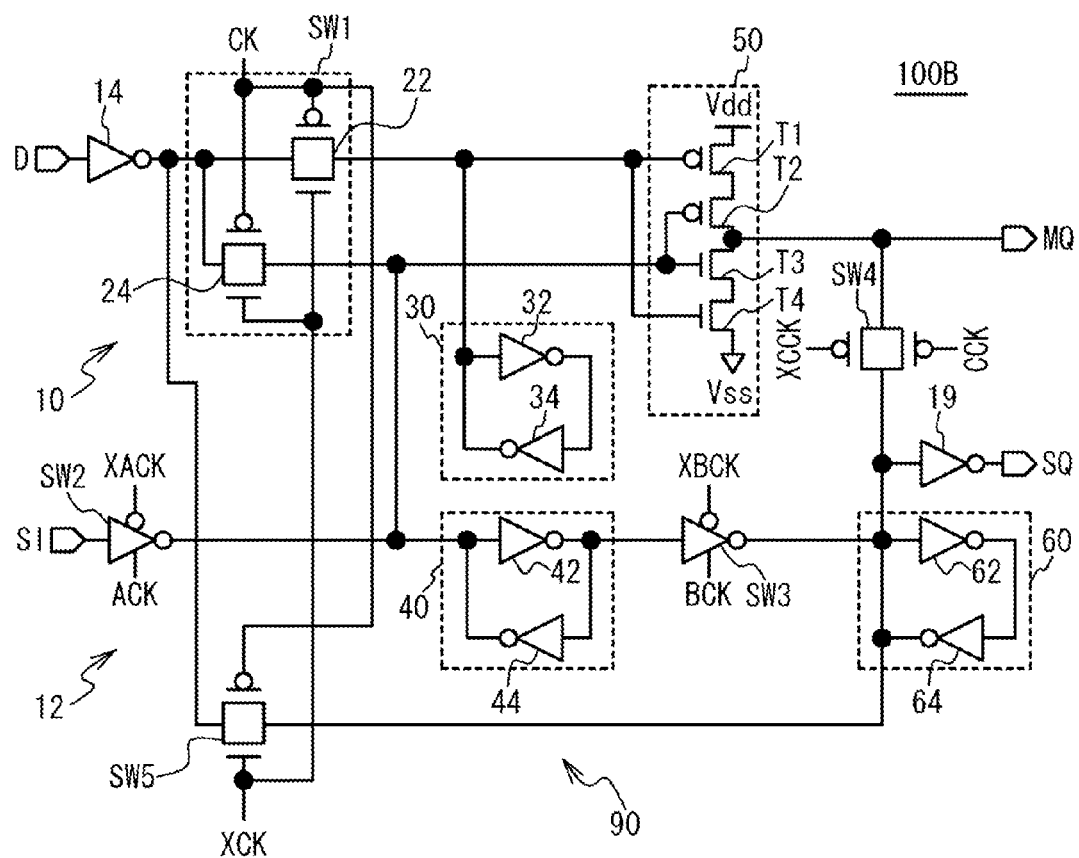
FIG. 7 is a circuit diagram of a semiconductor integrated circuit in accordance with a third embodiment.

FIG. 7 is a circuit diagram of a semiconductor integrated circuit in accordance with a third embodiment. Parts of the third embodiment that are the same as corresponding those of the first embodiment (FIG. 2) are given the same reference numbers, and a description thereof is omitted here.

A scan test circuit 100B of the third embodiment is equipped with a third switch SW5 driven by the clock signal CK, which is also used to drive the first switch SW1. The input signal from the data input terminal D is split into two at the rear stage of the inverter 14, one of which is input to the third data hold circuit 60 via the fifth switch SW5. An interconnection that connects the data input terminal D and the third data hold circuit 60, and the fifth switch SW5 form a data input circuit 90, which applies the input signal from the data input terminal D to the third data hold circuit 60 without passing through the gate circuit 50.

The operation of the scan test circuit 100B of the third embodiment is primarily identical to that of the first embodiment, and is capable of suppressing destroy of data due to soft error and reducing the circuit area like the first embodiment. When data is written in the normal operation, the input signal is applied to the third data hold circuit 60 from the data input terminal D without passing through the gate circuit 50, and the reliability of the operation of the third data hold circuit 60 is further improved.

In the first through third embodiments, the gate circuit 50 is configured to output the inverted signal of the data held in the first data hold circuit 30 and the second data hold circuit 40. However, the configuration of the gate circuit 50 is not limited to the above. The gate circuit 50 may have any configuration that outputs the signal corresponding to data in a case where the first data hold circuit 30 and the second data hold circuit 40 have the same data.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A semiconductor integrated circuit comprising:
    a first data hold circuit configured to hold an input signal from a first input terminal;
    a second data hold circuit configured to hold the input signal from the first input terminal and an input signal from a second input terminal;
    a gate circuit configured to input an output signal of the first data hold circuit and an output signal of the second data hold circuit and to output a signal corresponding to the output signals of the first and second data hold circuits when the output signals of the first and second data hold circuits are the same as each other; and
    a third data hold circuit configured to receive the output signal of both the gate circuit and the second data hold circuit and to hold the output signal of either the gate circuit or the second data hold circuit, and outputs the output signal to an output terminal.

2. The semiconductor integrated circuit according to claim 1, wherein the third data hold circuit has a drivability smaller than that of the gate circuit.

3. The semiconductor integrated circuit according to claim 1, wherein:
    a data signal is input via the first input terminal in a normal operation; and
    a test signal is input via the second input terminal in a scan operation.

4. The semiconductor integrated circuit according to claim 3, further comprising a gate output switch provided between the gate circuit and the third data hold circuit, wherein the gate output switch is constantly ON in the normal operation, and is constantly OFF in the scan operation.

5. The semiconductor integrated circuit according to claim 3, wherein:
    the third data hold circuit is configured to hold the output signal of the gate circuit in the normal operation and to hold the output signal of the second data hold circuit in the scan operation.

6. The semiconductor integrated circuit according to claim 1, wherein:
    the third data hold circuit has a drivability that is smaller than that of the gate circuit and is greater than half the drivability of the gate circuit;
    the gate circuit outputs a signal corresponding to the output signals of the first and second data hold circuits when the output signals of the first and second data hold circuits are the same as each other; and
    the gate circuit outputs another signal at an intermediate level between high and low levels of the output signals of the first and second data hold circuits when the output signals of the first and second data hold circuits are different from each other.

7. The semiconductor integrated circuit according to claim 6, wherein:
    the gate circuit includes a first transistor of a first conduction type and a second transistor of a second conduction type, the first and second transistors being connected in series between a first power supply and a second power supply;
    the output signal of the first data hold circuit is applied to a gate of one of the first and second transistors, and the output signal of the second data hold circuit is applied to a gate of the other; and
    the output signal of the gate circuit is output via an intermediate node between the first transistor and the second transistor.

8. The semiconductor integrated circuit according to claim 1, further comprising a data input circuit configured to input the input signal from the first input terminal without passing through the gate circuit.

9. The semiconductor integrated circuit according to claim 1, wherein each of the first data hold circuit, the second data hold circuit and the data hold circuit includes multiple inverters connected in a loop form.

10. The semiconductor integrated circuit according to claim 1, wherein:
    the gate circuit includes a first transistor of a first conduction type, a second transistor of the first conduction type, a third transistor of a second conduction type, and a fourth transistor of the second conduction type, the first through fourth transistors being connected in series between a first power supply and a second power supply;
    the output signal of the first data hold circuit is applied to a gate of one of the first and second transistors, and the output signal of the second data hold circuit is applied to a gate of the other;
    the output signal of the first data hold circuit is applied to a gate of one of the third and fourth transistors, and the output signal of the second data hold circuit is applied to a gate of the other;
    the output signal of the gate circuit is output via an intermediate node between the second transistor and the third transistor.

11. The semiconductor integrated circuit according to claim 3, further comprising a first switch provided between the first input terminal and the first data hold circuit and between the first input terminal and the second data hold circuit, wherein the first switch is ON at the time of data writing in the normal operation and is OFF at the time of data holding in the normal operation and in the scan operation.

12. The semiconductor integrated circuit according to claim 3, further comprising a second switch provided between the second input terminal and the second data hold circuit, and a third switch provided between the second data hold circuit and the third data hold circuit, wherein the second and third switches are constantly OFF in the normal operation, and are switched to ON or OFF complementarily in the scan operation.

* * * * *